US012685020B2

(12) United States Patent
Uno et al.

(10) Patent No.: US 12,685,020 B2
(45) Date of Patent: Jul. 14, 2026

(54) THERMOELECTRIC POWER GENERATION SYSTEM

(71) Applicants: E-ThermoGentek Co., Ltd., Kyoto (JP); KAWASAKI JUKOGYO KABUSHIKI KAISHA, Kobe (JP); KAWASAKI THERMAL ENGINEERING CO., LTD., Kusatsu (JP)

(72) Inventors: Takashi Uno, Kyoto (JP); Nao Majima, Kyoto (JP); Michio Okajima, Kyoto (JP); Keiichi Ohata, Kyoto (JP); Shutaro Nambu, Kyoto (JP); Makoto Goda, Kobe (JP); Minoru Nakayasu, Kobe (JP); Yoma Kaneda, Kobe (JP); Masamichi Sakaguchi, Tokyo (JP); Takahide Yanagida, Kusatsu (JP); Yusei Maeda, Kusatsu (JP)

(73) Assignee: E-ThermoGentek Co., Ltd., Kyoto (JP)

( * ) Notice: Subject to any disclaimer, the term of this patent is extended or adjusted under 35 U.S.C. 154(b) by 0 days.

(21) Appl. No.: 18/277,998

(22) PCT Filed: Feb. 26, 2021

(86) PCT No.: PCT/JP2021/007487
§ 371 (c)(1),
(2) Date: Aug. 20, 2023

(87) PCT Pub. No.: WO2022/180818
PCT Pub. Date: Sep. 1, 2022

(65) Prior Publication Data
US 2024/0147857 A1 May 2, 2024

(51) Int. Cl.
*H10N 10/17* (2023.01)
*B01D 3/00* (2006.01)
(Continued)

(52) U.S. Cl.
CPC ............. *H10N 10/17* (2023.02); *B01D 3/007* (2013.01); *B01D 5/0003* (2013.01); *F28D 7/10* (2013.01);
(Continued)

(58) Field of Classification Search
CPC ........ H10N 10/00–857; F28D 7/10–14; F28D 7/106; F01N 5/025; B01D 3/007; B01D 5/0003; F28F 13/00; F28F 2013/001
(Continued)

(56) References Cited

U.S. PATENT DOCUMENTS

| | | | | |
|---|---|---|---|---|
| 4,095,998 | A | * | 6/1978 | Hanson .................. H10N 10/17 136/218 |
| 4,312,402 | A | * | 1/1982 | Basiulis ................. H10N 10/00 165/909 |

(Continued)

FOREIGN PATENT DOCUMENTS

| | | | |
|---|---|---|---|
| JP | 2009250539 A | * | 10/2009 |
| JP | 2009-267316 A | | 11/2009 |

(Continued)

OTHER PUBLICATIONS

JP-2013110825-A English machine translation (Year: 2013).*
(Continued)

*Primary Examiner* — Andrew J Golden
(74) *Attorney, Agent, or Firm* — Renner, Otto, Boisselle & Sklar, LLP

(57) ABSTRACT

A thermoelectric power generation system 20 includes a heat exchanger 1 having double tubes which are an inner tube 1*a* and an outer tube 1*b*, and a thermoelectric power generation module 2 mounted between the inner tube and the outer tube. The thermoelectric power generation module generates thermoelectric power using a temperature difference between a medium inside the inner tube and a medium
(Continued)

outside the outer tube, and a highly thermal conductive elastic sheet 3a, 3b is mounted between the thermoelectric power generation module and the inner tube and/or the outer tube in close contact therewith.

3 Claims, 6 Drawing Sheets

(51) Int. Cl.
| | |
|---|---|
| *B01D 5/00* | (2006.01) |
| *F28D 7/10* | (2006.01) |
| *F28F 13/00* | (2006.01) |
| *H10N 10/13* | (2023.01) |

(52) U.S. Cl.
CPC ............. *F28F 13/00* (2013.01); *H10N 10/13* (2023.02); *F28F 2013/001* (2013.01)

(58) Field of Classification Search
USPC ........................................ 136/205, 208–210
See application file for complete search history.

(56) References Cited

U.S. PATENT DOCUMENTS

| | | | | |
|---|---|---|---|---|
| 4,734,139 | A * | 3/1988 | Shakun ................. | H10N 10/13 |
| | | | | 136/208 |
| 2009/0000309 | A1 * | 1/2009 | Hershberger .......... | H10N 10/13 |
| | | | | 62/3.5 |
| 2009/0025770 | A1 * | 1/2009 | Lofy ..................... | H10N 10/13 |
| | | | | 136/204 |
| 2011/0146743 | A1 * | 6/2011 | Oesterle ................. | H10N 10/17 |
| | | | | 136/201 |
| 2012/0048324 | A1 * | 3/2012 | Willats ................... | H10N 10/13 |
| | | | | 60/320 |
| 2012/0324909 | A1 * | 12/2012 | Brehm ...................... | F28F 1/32 |
| | | | | 62/3.2 |
| 2016/0209124 | A1 * | 7/2016 | Da Silvaa ............... | F28D 7/082 |
| 2017/0194548 | A1 * | 7/2017 | Wakino .................. | H10N 10/82 |
| 2018/0130938 | A1 | 5/2018 | Kohtani et al. | |
| 2018/0315915 | A1 * | 11/2018 | Azzouz .................. | H10N 10/13 |
| 2018/0363852 | A1 * | 12/2018 | Kim ...................... | F25J 1/0025 |
| 2019/0195110 | A1 * | 6/2019 | Hermida Domínguez .................. | |
| | | | | H10N 10/17 |
| 2019/0339013 | A1 * | 11/2019 | Haefele ................. | F28D 20/021 |

FOREIGN PATENT DOCUMENTS

| | | | | |
|---|---|---|---|---|
| JP | 2009-278830 | A | | 11/2009 |
| JP | 2011-211764 | A | | 10/2011 |
| JP | 2013-002661 | A | | 1/2013 |
| JP | 2013-033810 | A | | 2/2013 |
| JP | 2013110218 | A | | 6/2013 |
| JP | 2013110825 | A | * | 6/2013 |
| JP | 2013165240 | A | | 8/2013 |
| JP | 2017-221066 | A | | 12/2017 |
| JP | 2018-206881 | A | | 12/2018 |

OTHER PUBLICATIONS

JP-2009250539-A English machine translation (Year: 2009).*
International Search Report for corresponding Application No. PCT/JP2021/007487, mailed Apr. 6, 2021.

* cited by examiner 2 0

2

3 a 3 b

4

1 a   1 b

1

2 0

1b   1a 4      5

THERMOELECTRIC POWER GENERATION SYSTEM

TECHNICAL FIELD

The present invention relates to a thermoelectric power generation system including a heat exchanger having double tubes.

BACKGROUND ART

In a current industrial society, mainly in a factory, an electric power plant, a steel plant, an automobile, a building, an illumination, a ship, etc., an enormous waste heat amount of 60% or more of the total primary energy supply amount has been discharged to global environment. It has been assumed that 75% or more of such waste heat is drainage water or exhaust gas at 250° C. or lower.

Such waste heat is generally transported through an exhaust heat pipe. In a heat exchanger that exchanges heat between, e.g., high-temperature gas flowing in the pipe and, e.g., cold water flowing outside the pipe or a heat exchanger that conversely, exchanges heat between exhaust heat collected by a heat collection tube placed in exhaust heat gas and, e.g., cold water flowing in a pipe provided in the heat collection tube, the high-temperature gas can be cooled, but it is difficult to reutilize heat of high-temperature gas exchanged with, e.g., the cold water. This has been an issue for energy saving.

As shown in FIG. 7, Patent Document 1 discloses a tubular heat exchanger with a thermoelectric power generation function, the tubular heat exchanger being configured such that thermoelectric power generation modules 110 with a flexible structure are mounted between the outside of a drainage pipe 100 in which, e.g., high-temperature gas or hot water 100A flows and the inside of a coolant water pipe 120 in which coolant water 120A flows to generate power using a temperature difference therebetween.

CITATION LIST

Patent Document

PATENT DOCUMENT 1: Japanese Unexamined Patent Publication No. 2009-267316

SUMMARY OF THE INVENTION

Technical Problem

In the heat exchanger disclosed in Patent Document 1, the thermoelectric power generation modules are directly cooled with water, and for this reason, need to be provided with a waterproof unit such as attachment of a waterproof sheet. However, e.g., the waterproof sheet is made of resin, and for this reason, if such a waterproof unit is provided, a thermal loss is caused, leading to degradation of the power generation efficiency of the thermoelectric power generation module 110.

In a case where a heat exchanger including double tubes is placed in exhaust heat gas from, e.g., a boiler, the heat exchanger needs to have an excellent pressure resistance and a high reliability without leakage in order not to adversely affect a boiler system. However, conventionally for the heat exchanger, the high reliability as described above has not been taken into consideration.

The present invention has been made in view of the above-described points, and a main object thereof is to provide a thermoelectric power generation system with a high thermoelectric power generation efficiency and a high reliability.

Solution to the Problem

A thermoelectric power generation system according to the present invention includes a heat exchanger having double tubes which are an inner tube and an outer tube and a thermoelectric power generation module mounted between the inner tube and the outer tube. The thermoelectric power generation module generates thermoelectric power using a temperature difference between a medium inside the inner tube and a medium outside the outer tube, and a highly thermal conductive elastic sheet is mounted between the thermoelectric power generation module and the inner tube and/or the outer tube in close contact therewith.

Advantages of the Invention

According to the present invention, since the elastic sheet is mounted between the thermoelectric power generation module and the inner tube and/or the outer tube in close contact therewith, a heat transfer loss between the thermoelectric power generation module and the inner tube and/or the outer tube can be reduced. Thus, a great temperature difference in the thermoelectric power generation module can be ensured, and therefore, a thermoelectric power generation efficiency can be enhanced.

Further, since the elastic sheet has elasticity, the elastic sheet can absorb a thermal expansion difference even if there is the thermal expansion difference in a radial direction between the inner tube and the outer tube. Thus, stress on the thermoelectric power generation module can be reduced. As a result, the thermoelectric power generation system with a high reliability can be achieved.

In addition, since the heat exchanger includes the double tubes which are the inner tube and the outer tube with pressure resistance, the heat exchanger having an excellent pressure resistance without leakage can be achieved. As a result, even if the heat exchanger is placed in exhaust heat gas from, e.g., a boiler, an adverse effect on a boiler system can be prevented.

DESCRIPTION OF EMBODIMENTS

Hereinafter, an embodiment of the present invention will be described in detail based on the drawings. Note that the present invention is not limited to the following embodiment. Moreover, changes can be made as necessary without departing from a scope in which advantageous effects of the present invention can be provided.

Figure 1:
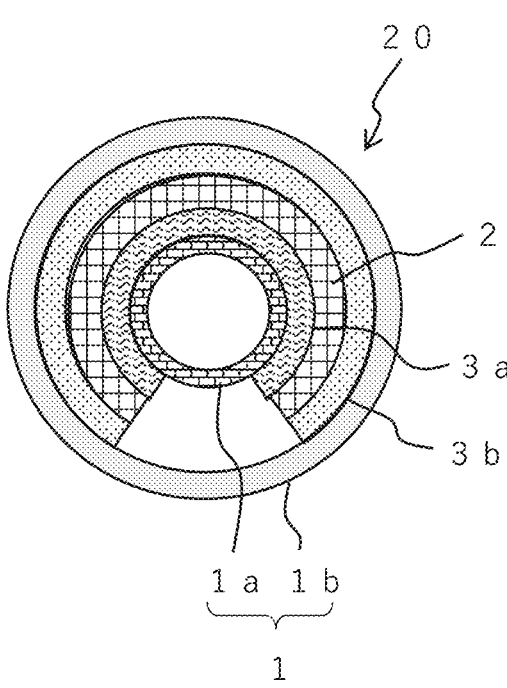
FIG. 1 is a sectional view schematically showing the configuration of a thermoelectric power generation system in one embodiment of the present invention.

FIG. 1 is a view schematically showing the configuration of a thermoelectric power generation system in one embodiment of the present invention, FIG. 1 showing a sectional view perpendicular to the axial direction of double tubes forming a heat exchanger.

As shown in FIG. 1, a thermoelectric power generation system 20 in the present embodiment includes a heat exchanger 1 having double tubes which are an inner tube 1a and an outer tube 1b. A thermoelectric power generation module 2 is mounted between the inner tube 1a and the outer tube 1b. The thermoelectric power generation module 2 generates thermoelectric power using a temperature difference between a medium inside the inner tube 1a and a medium outside the outer tube 1b.

An elastic sheet 3a having elasticity is mounted between the thermoelectric power generation module 2 and the inner tube 1a in close contact with the thermoelectric power generation module 2 and the inner tube 1a. Moreover, an elastic sheet 3b having elasticity is mounted between the thermoelectric power generation module 2 and the outer tube 1b in close contact with the thermoelectric power generation module 2 and the outer tube 1b.

According to the present embodiment, since the elastic sheets 3a, 3b having the elasticity are mounted between the thermoelectric power generation module 2 and the inner tube 1a and between the thermoelectric power generation module 2 and the outer tube 1b in close contact therewith, a heat transfer loss between the thermoelectric power generation module 2 and each of the inner tube 1a and the outer tube 1b can be reduced. Thus, a great temperature difference in the thermoelectric power generation module 2 can be ensured, and therefore, a thermoelectric power generation efficiency can be enhanced.

Further, since the elastic sheets 3a, 3b have the elasticity, the elastic sheets 3a, 3b can absorb a thermal expansion difference even if there is the thermal expansion difference in a radial direction between the inner tube 1a and the outer tube 1b. Thus, stress on the thermoelectric power generation module 2 can be reduced. As a result, the thermoelectric power generation system with a high reliability can be achieved.

In addition, since the heat exchanger 1 includes the double tubes which are the inner tube 1a and the outer tube 1b with pressure resistance, the heat exchanger 1 having an excellent pressure resistance without leakage can be achieved. As a result, even if the heat exchanger 1 is placed in exhaust heat gas from, e.g., a boiler, an adverse effect on a boiler system can be prevented. The inner tube 1a and the outer tube 1b are preferably seamless tubes, i.e., tubes with no seams, but tubes obtained in such a manner that steel plates are machined into a cylindrical shape and seams thereof are welded may be used.

The elastic sheets 3a, 3b are only required to be made of materials having elasticity, and for example, a silicone sheet, a carbon sheet, or rubber in which carbon nanotubes are dispersed may be used. Moreover, the elastic sheets 3a, 3b are preferably made of highly thermal conductive materials with a high thermal conductivity. Note that the elastic sheet 3a, 3b may be mounted between the thermoelectric power generation module 2 and either one of the inner tube 1a or the outer tube 1b.

Figure 2:
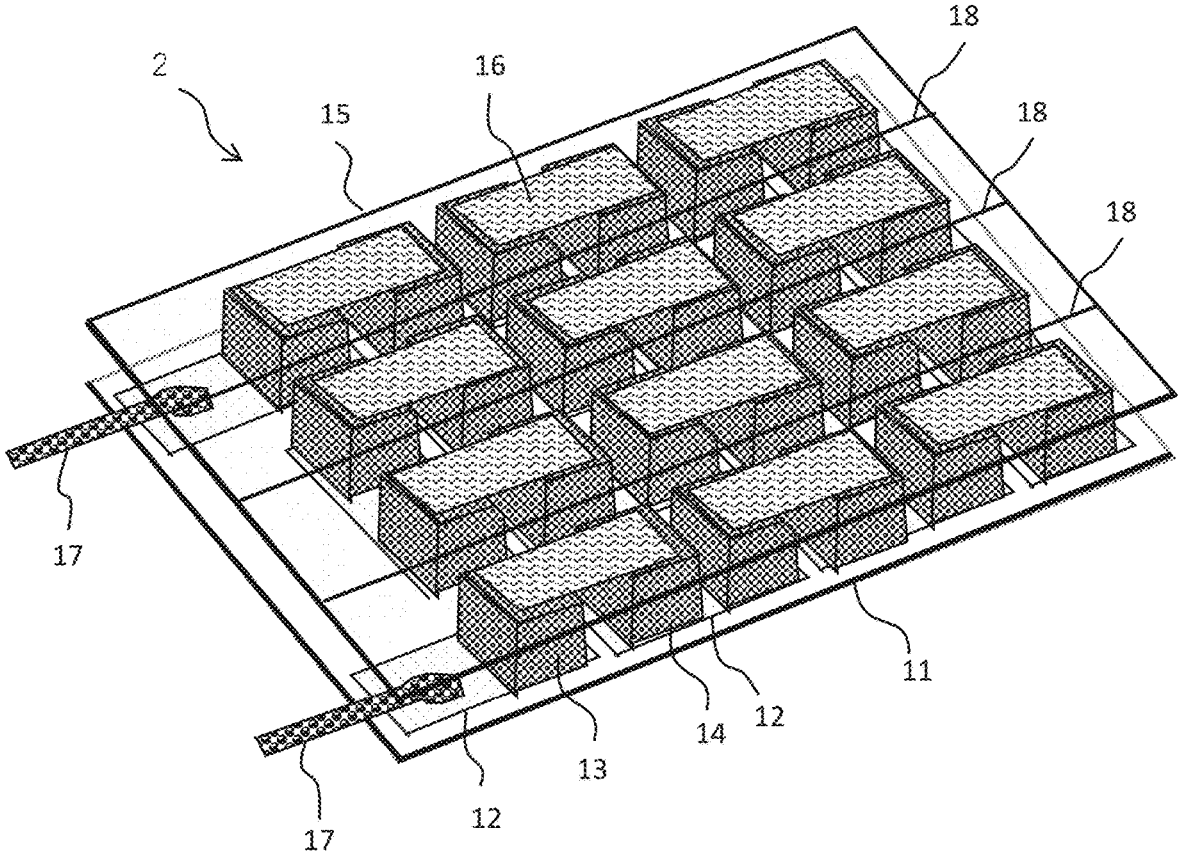
FIG. 2 is a view showing the configuration of a thermoelectric power generation module.

FIG. 2 is a view showing a specific configuration of the thermoelectric power generation module 2.

As shown in FIG. 2, wiring lands 12 are formed on a flexible base substrate 11, and P-type thermoelectric elements 13 and N-type thermoelectric elements 14 are alternately arrayed and mounted on the wiring lands 42. The P-type thermoelectric element 13 and the N-type thermoelectric element 14 are connected in series through a wiring layer 16 formed on a flexible upper wiring board 15. Generated thermoelectric power is taken out through lead-out electrodes 17.

The upper wiring board 15 is formed with multiple slits 18 along the direction in which the P-type thermoelectric element 13 and the N-type thermoelectric element 14 are connected in series. With this configuration, the thermoelectric power generation module 2 is easily bendable in the direction orthogonal to the slits 18. In order to form the thermoelectric power generation system using such a thermoelectric power generation module 2, the thermoelectric power generation module 2 is wound around the inner tube 1a. At this time, by aligning the slits 18 with the axial direction of the inner tube 1a, the thermoelectric power generation module 2 easily closely contacts the inner tube 1a.

The thermoelectric power generation system 20 shown in FIG. 1 is specifically configured as follows. The outer diameter of the inner tube 1a is 25.4 mm, the outer size of the thermoelectric power generation module 2 is 5 cm square, the thickness of the thermoelectric power generation module 2 is 1.2 mm, and the outer diameter of the seamless outer tube 1b is 36 mm. The elastic sheets 3a, 3b having the elasticity are silicone sheets with a thermal conductivity of 4 W/mK and a thickness of 1 mm. Note that in terms of a heat life, the elastic sheet 3a, 3b is preferably attached to at least one of the inner tube 1a or the outer tube 1b on the medium side to be cooled. As the elastic sheet 3a having the elasticity, e.g., a carbon sheet having a high thermal conductivity (30 W/mK or more) or rubber having a thermal conductivity enhanced by dispersion of carbon nanotubes may be used.

Figures 3, 4:
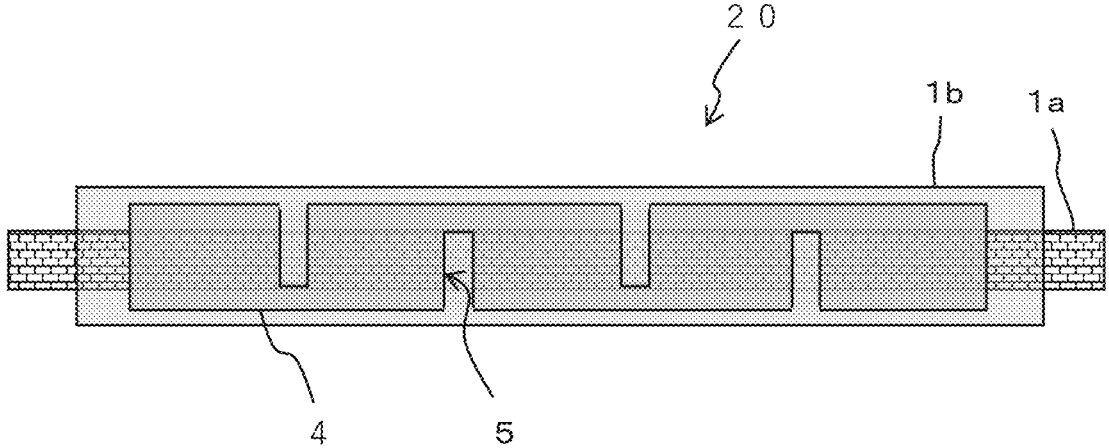
FIG. 3 is a sectional view showing a modification of the thermoelectric power generation system.
FIG. 4 is a perspective view of the thermoelectric power generation system from the side thereof.

FIG. 3 is a view showing a modification of the thermoelectric power generation system 20 shown in FIG. 1, FIG. 3 showing a sectional view perpendicular to the axial direction of the double tubes forming the heat exchanger 1.

As shown in FIG. 3, the thermoelectric power generation system 20 in the present modification is configured such that a heat transfer sheet 4 having a high thermal conductivity is inserted between the elastic sheet 3b outside the thermoelectric power generation module 2 and the outer tube 1b in the configuration of the thermoelectric power generation system 20 shown in FIG. 1. With this configuration, the heat transfer loss between the thermoelectric power generation module 2 and the outer tube 1b can be reduced, and therefore, a great temperature difference in the thermoelectric power generation module 2 can be ensured and the thermoelectric power generation efficiency can be enhanced.

The heat transfer sheet 4 is only required to be made of a material having a high thermal conductivity, and for example, metal having a high thermal conductivity, such as Cu or Al, may be used. In a case where the heat transfer sheet 4 is a carbon sheet, the carbon sheet as the heat transfer sheet 4 can be easily inserted because of a high thermal conductivity (30 W/mK or more), a small thickness (0.1 mm or less), and a small coefficient of friction with other materials.

Note that the heat transfer sheet 4 is inserted between the elastic sheet 3b outside the thermoelectric power generation module 2 and the outer tube 1b in FIG. 3, but may be inserted between the elastic sheet 3a inside the thermoelectric power generation module 2 and the inner tube 1*a* or be inserted into both these positions.

In a case where the heat transfer sheet 4 is a metal tube, the heat transfer sheet 4 is preferably provided, as shown in FIG. 4, with multiple slits 5 in the axial direction of the inner tube 1*a* and the outer tube 1*b*, the slits 5 extending in the direction perpendicular to the axial direction. FIG. 4 is a perspective view of the thermoelectric power generation system 20 from a side parallel with the axial direction of the double tubes forming the heat exchanger.

Since the heat transfer sheet 4 is provided with the multiple slits 5 in the axial direction, the heat transfer sheet 4 has flexibility in the axial direction. With this configuration, even if there is a thermal expansion difference in the axial direction between the inner tube 1*a* and the outer tube 1*b*, such a thermal expansion difference can be absorbed by the heat transfer sheet 4. Thus, the stress on the thermoelectric power generation module 2 can be reduced. As a result, the thermoelectric power generation system with a high reliability can be achieved.

Note that in a case where the heat transfer sheet 4 is the carbon sheet, the carbon sheet has flexibility, and therefore, the heat transfer sheet 4 can absorb, with no slits 5 in the heat transfer sheet 4, the thermal expansion difference in the axial direction between the inner tube 1*a* and the outer tube 1*b*.

In order to form the double-tube heat exchanger forming the above-described thermoelectric power generation system 20, the inner tube to which the components up to the heat transfer sheet 4 are attached is only required to be inserted into the outer tube 1*b*. In a case where the heat transfer sheet 4 is the carbon sheet, the carbon sheet has less friction with the outer tube 1*b*, and therefore, is easily inserted even with a small dimension tolerance. In this case, it is important that the heat transfer loss is reduced by close contact among the inner tube 1*a*, the thermoelectric power generation module 2, the heat transfer sheet 4, and the outer tube 1*b* and electromotive force of thermoelectric power is increased by an increase in the temperature difference in the thermoelectric power generation module 2. A technique therefor is assumed to be a technique of expanding the inner tube 1*a* in the radial direction by applying a high pressure to the inside of the inner tube 1*a*. This technique is particularly suitable for uniformly expanding a long tube such as a tube of 1 m or more. This technique provides an effect of uniformizing power generation characteristics even when the thermoelectric power generation module is attached to a long tube.

Figure 5:
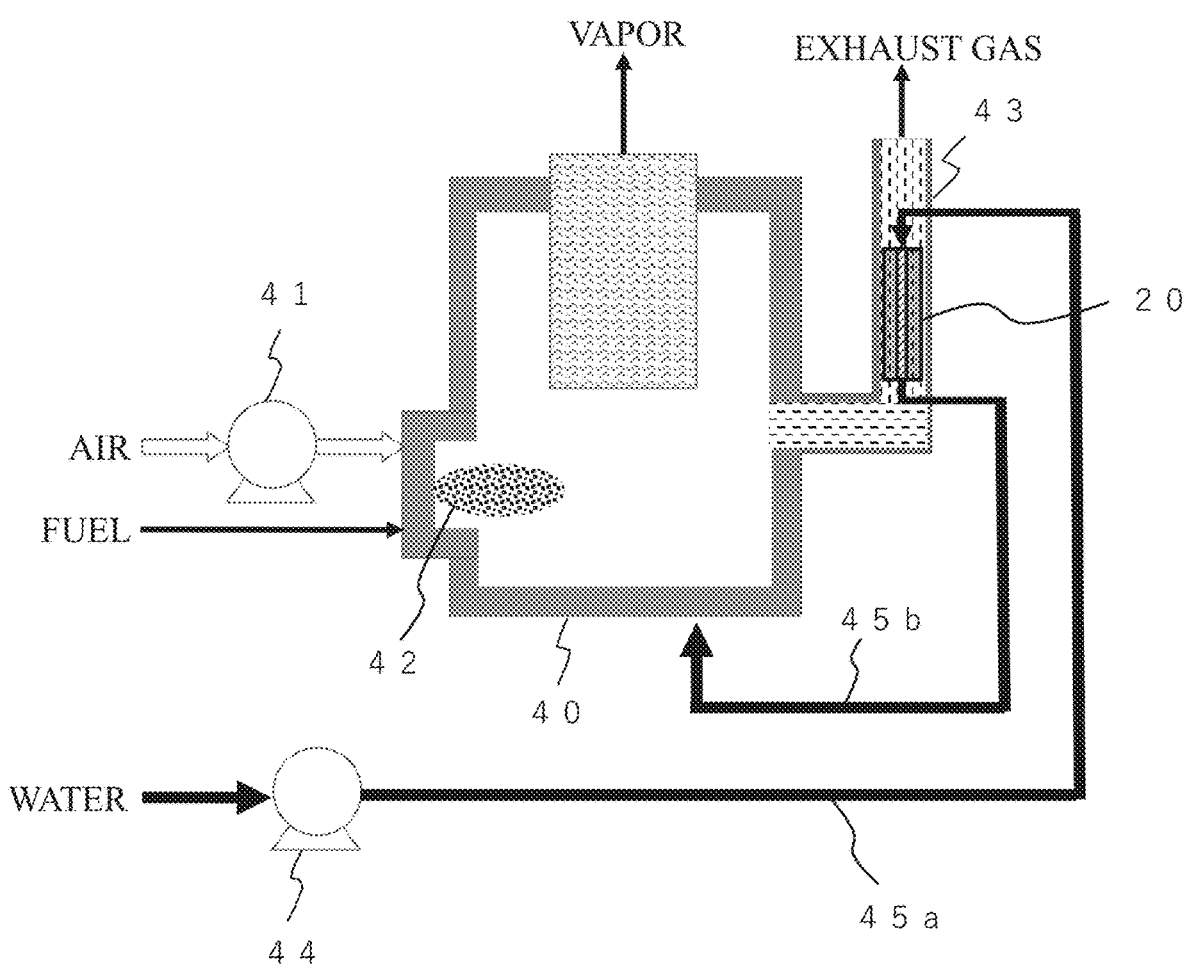
FIG. 5 is a view showing an example where the thermoelectric power generation system is applied to a boiler.

FIG. 5 is a view showing an example where the thermoelectric power generation system 20 in the present embodiment is applied to a boiler.

As shown in FIG. 5, a boiler 40 mixes fuel and air supplied by a blower 41 to make combustion with a burner 42, thereby generating vapor using heat of combustion gas. The heat exchanger of the thermoelectric power generation system 20 is arranged in a gas duct 43 in which exhaust gas from the boiler 40 passes. One end of the inner tube (not shown) of the heat exchanger is connected to a water tube 45*a* in which water from a water supply pump 44 passes, and the other end of the inner tube is connected to a water tube 45*b* for supplying water to the boiler 40.

That is, in the thermoelectric power generation system 20 arranged in the gas duct 43, the medium outside the outer tube (not shown) is boiler exhaust gas, and the medium inside the inner tube is boiler supply water. With this configuration, the thermoelectric power generation system 20 can generate thermoelectric power while an economizer function of preheating the boiler supply water inside the inner tube by the boiler exhaust gas outside the outer tube is fulfilled.

The heat exchanger of the thermoelectric power generation system 20 may be arranged in a recovery chamber for recovering water vapor or organic solvent vapor instead of being arranged in the gas duct 43 in which exhaust gas from the boiler 40 passes. In this case, the medium outside the outer tube is the water vapor or the organic solvent vapor, and the medium inside the inner tube is coolant water. Thermoelectric power can be generated while the water vapor or the organic solvent vapor is recovered.

Figure 6:
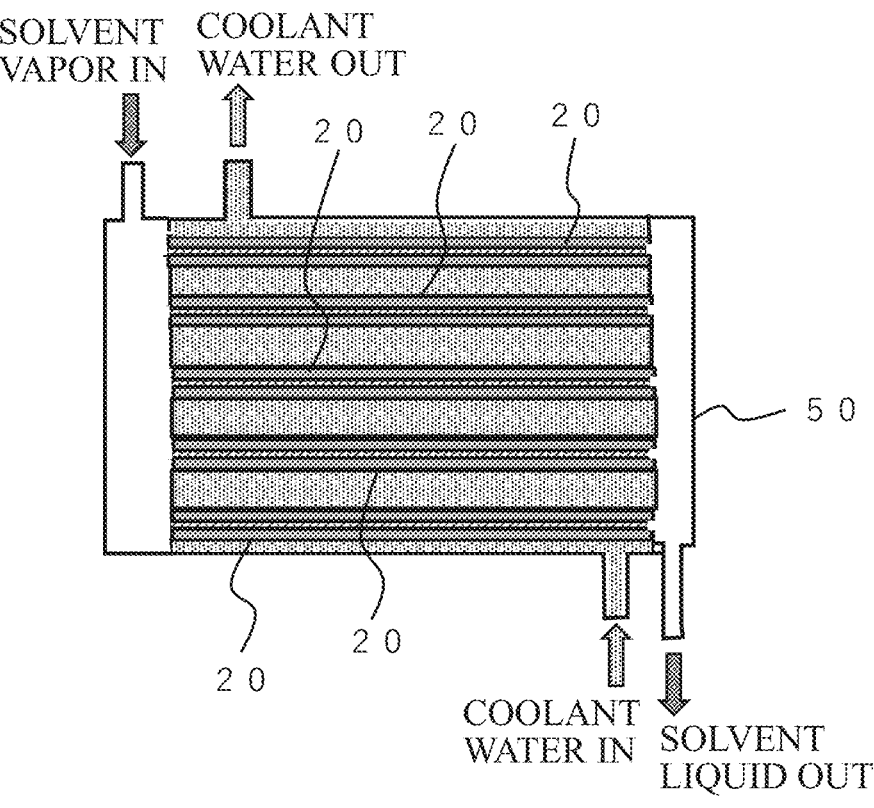
FIG. 6 is a view showing an example where the thermoelectric power generation system is arranged in a distillation-condensation recovery plant for an organic solvent.
Figure 7:
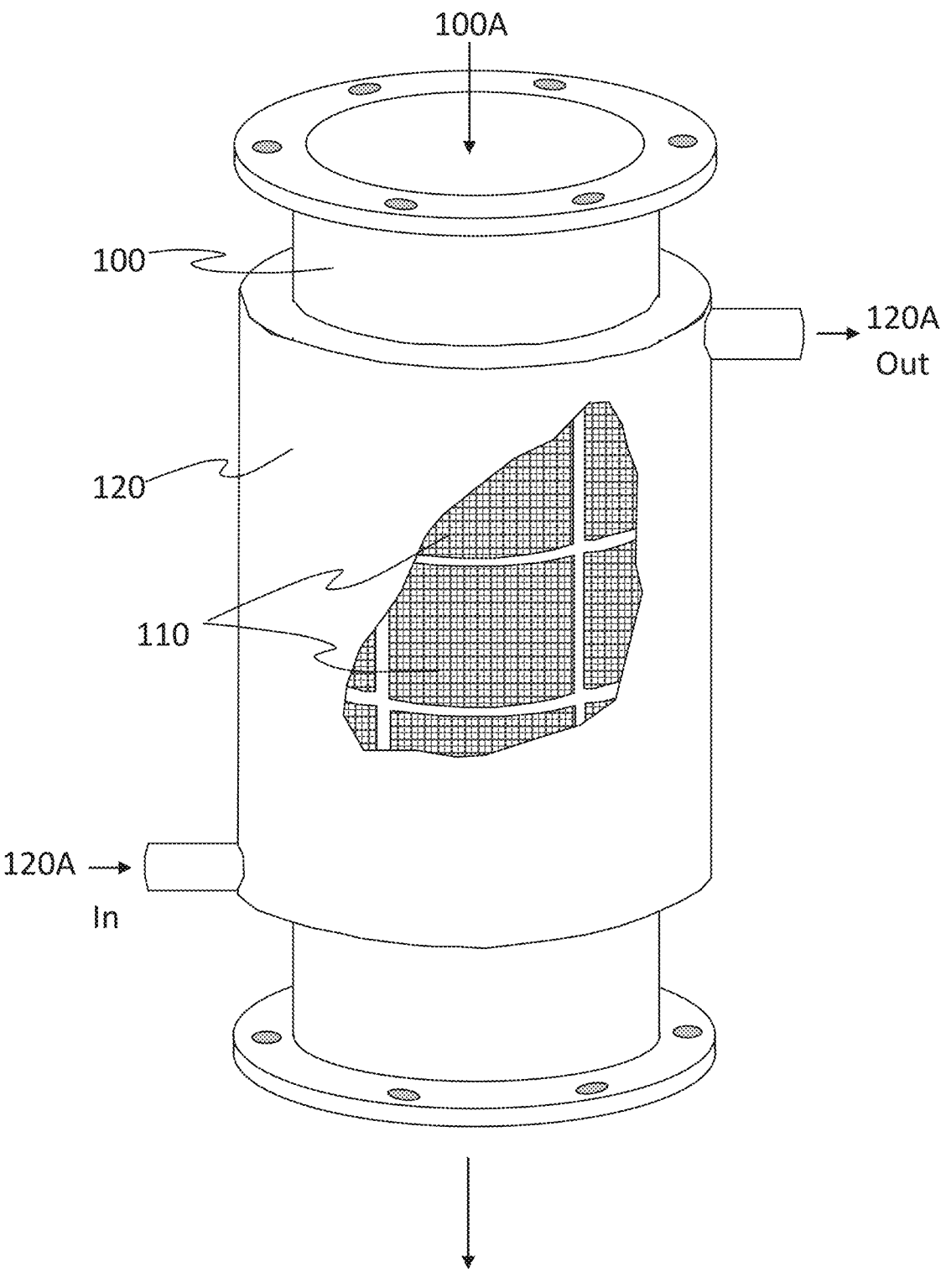
FIG. 7 is an outer perspective view showing a conventional heat exchanger with a thermoelectric power generation function.

As shown in FIG. 6, multiple heat exchangers of the thermoelectric power generation system 20 may be collectively arranged in a distillation-condensation recovery plant 50 for an organic solvent. In this case, organic solvent vapor flows inside the inner tube (not shown), and is condensed by cooling of the outside of the outer tube (not shown) with water. Thermoelectric power can be generated while the organic solvent vapor is recovered as liquid.

For example, in a case where toluene vapor (organic solvent vapor) at a vapor gas temperature of 110° C. flows inside the inner tube and is condensed by cooling of the outside of the outer tube with coolant water at 25° C. and thermoelectric power is generated while the organic solvent vapor is recovered as liquid, the thermoelectric power generation module 2 obtains a temperature difference of about 70° C.

DESCRIPTION OF REFERENCE CHARACTERS

1 Heat Exchanger
1*a* Inner Tube
1*b* Outer Tube
2 Thermoelectric Power Generation Module
3*a*, 3*b* Elastic Sheet
4 Heat Transfer Sheet
5 Slit
11 Base Substrate
12 Wiring Land
13 P-Type Thermoelectric Element
14 N-Type Thermoelectric Element
15 Upper Wiring Board
16 Wiring Layer
17 Electrode
18 Slit
20 Thermoelectric Power Generation System
40 Boiler
41 Blower
42 Burner
43 Gas Duct
44 Water Supply Pump
45*a*, 45*b* Water Tube
50 Distillation-Condensation Recovery Plant

The invention claimed is:

1. A method of manufacturing a thermoelectric power generation system including:

a heat exchanger including double tubes which are an inner tube and an outer tube, wherein the outer tube is a seamless cylindrical tube; and a thermoelectric power generation module mounted between the inner tube and the outer tube, wherein in the thermoelectric power generation module, P-type thermoelectric elements and N-type thermoelectric elements are alternately arrayed and mounted on a flexible substrate, the substrate is formed with multiple slits along a direction in which the P-type thermoelectric elements and the N-type thermoelectric elements are connected in series, and the method comprises:

a step of winding the thermoelectric power generation module around the inner tube with the slits aligned with an axial direction of the inner tube, a step of inserting the inner tube into the outer tube with the thermoelectric power generation module wound around the inner tube, and a step of expanding the inner tube in a radial direction by applying a high pressure to an inside of the inner tube in order to mount the thermoelectric power generation module between the inner tube and the outer tube.

2. The method of claim 1, wherein in the step of inserting the inner tube into the outer tube, the inner tube is inserted into the outer tube with an elastic sheet wound between the inner tube and the thermoelectric power generation module.

3. The method of claim 1, wherein in the step of inserting the inner tube into the outer tube, the inner tube is inserted into the outer tube with an elastic sheet wound around an outer peripheral surface of the thermoelectric power generation module.

* * * * *